United States Patent
Sobek et al.

(10) Patent No.: US 6,268,624 B1
(45) Date of Patent: *Jul. 31, 2001

(54) METHOD FOR INHIBITING TUNNEL OXIDE GROWTH AT THE EDGES OF A FLOATING GATE DURING SEMICONDUCTOR DEVICE PROCESSING

(75) Inventors: Daniel Sobek, Portola Valley; Timothy Thurgate, Sunnyvale; Carl R. Huster, San Jose; Tuan Duc Pham, Santa Clara; Mark T. Ramsbey, Sunnyvale; Sameer S. Haddad, San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/364,982

(22) Filed: Jul. 31, 1999

(51) Int. Cl.[7] ............................................. H01L 21/8247
(52) U.S. Cl. ........................ 257/321; 257/316; 438/264
(58) Field of Search ...................................... 438/257–267, 438/593, 594; 257/315–322

(56) References Cited

U.S. PATENT DOCUMENTS

| 5,384,272 | * | 1/1995 | Ibok et al. . |
| 5,424,232 | * | 6/1995 | Yamauchi . |
| 5,460,992 | * | 10/1995 | Hasegawa . |
| 5,554,551 | * | 9/1996 | Hong . |
| 5,633,184 | * | 5/1997 | Tamura et al. ........................ 438/264 |

* cited by examiner

*Primary Examiner*—Richard Booth
(74) *Attorney, Agent, or Firm*—Lariviere, Grubman & Payne, LLP

(57) ABSTRACT

A method for making a ULSI MOSFET chip includes forming a MOSFET gate stack on a substrate, with a tunnel oxide layer being sandwiched between the gate stack and substrate. To prevent thickening of the tunnel oxide layer into a "gate edge lifting" profile during subsequent oxidation-causing steps, at least one protective barrier film is deposited or grown over the gate stack and tunnel oxide layer immediately after gate stack formation. Then, subsequent steps, including forming source and drain regions for the gate stack, can be undertaken without causing thickening of the tunnel oxide layer.

13 Claims, 2 Drawing Sheets

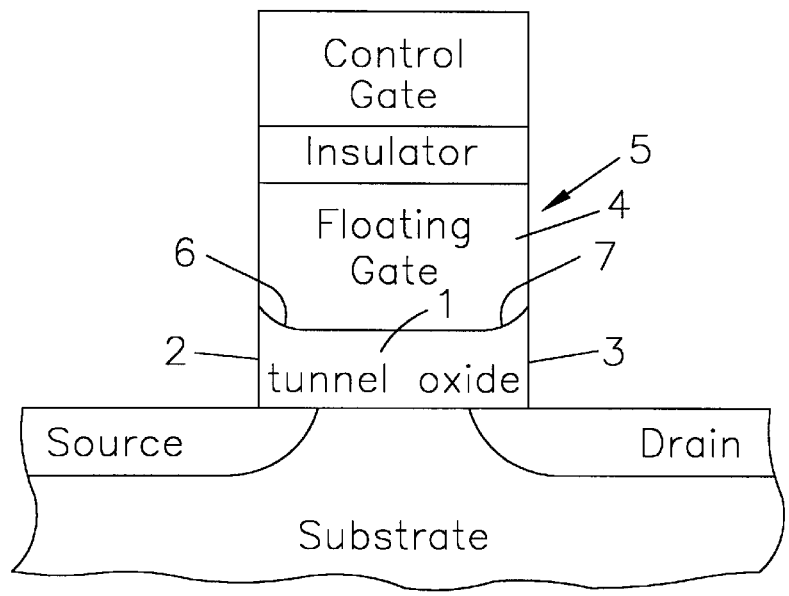
FIGURE 1
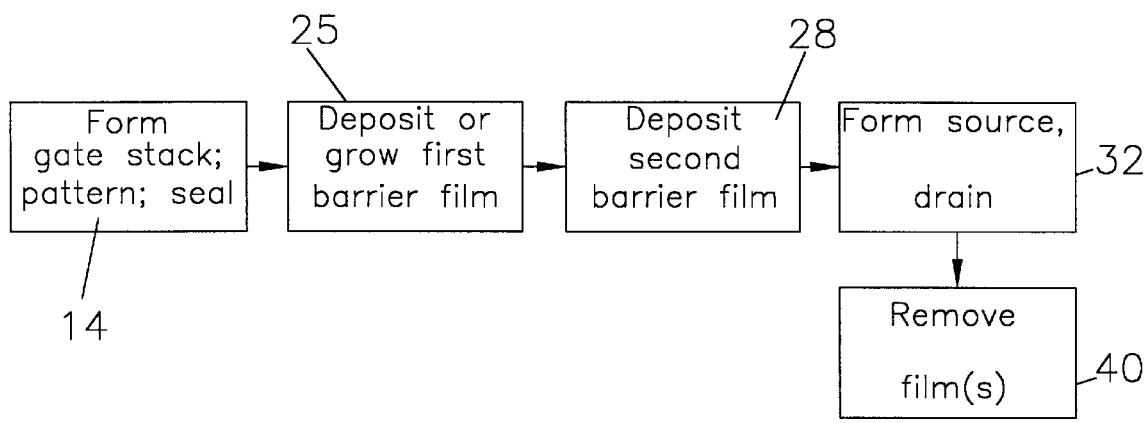
FIGURE 2 — process flow

METHOD FOR INHIBITING TUNNEL OXIDE GROWTH AT THE EDGES OF A FLOATING GATE DURING SEMICONDUCTOR DEVICE PROCESSING

TECHNICAL FIELD

The present invention relates generally to minimizing the thickness of a gate silicon dioxide at the edges of the gate of an ultra-large scale integration (ULSI) semiconductor device such as a ULSI metal oxide silicon field effect transistor (MOSFET), and more particularly to methods for inhibiting a local increase in the tunneling distance in the tunnel oxide at the gate edge of a floating gate EEPROM, or flash memory device.

BACKGROUND OF THE INVENTION

Semiconductor chips are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate stack on a Silicon substrate, and then forming a source region and a drain region in the substrate beneath the gate stack by implanting appropriate dopant materials into the areas of the substrate that are to become the source and drain regions. The gate stack is insulated from the substrate by a thin gate oxide layer, also referred to as a "tunnel oxide" layer, with small portions of the source and drain regions extending toward and virtually under the tunnel oxide layer.

Between the source and drain regions and under the tunnel oxide layer is a channel region, a portion of which is doped. The doped portion of the channel region typically is doped early in the fabrication process, with the channel dopant usually being implanted during the steps of forming the gate and source and drain regions. This generally-described structure cooperates to function as a transistor.

To promote proper transistor functioning, the overall tunnel oxide thickness is established in part by reliability concerns such as data retention, endurance, and so on; however, the edges of the tunnel oxide can grow during source/drain formation and other steps used to seal the floating gate to prevent unintentional transport of electrons out of the gate, such sealing being required because the presence of these electrons determines whether the device is programmed.

Excessive growth of the tunnel oxide at the gate edges, however, reduces the electric field that must be used to erase the device, i.e., to transport electrons from the floating gate to one of the source/drain regions using Fowler-Nordheim tunneling. This in turn undesirably reduces the speed of the erase operation, because Fowler-Nordheim tunneling varies exponentially with the electric field across the oxide layer, and the erase speed, as understood herein, varies strongly as a function of the tunnel oxide thickness. U.S. Pat. No. 5,077,691, owned by the same assignee as is the present invention and incorporated herein by reference, sets forth added details of flash EEPROM voltage erase operations.

It happens that the erase current takes a path through the end regions of the tunnel oxide layer that are directly above the source and drain. FIG. 1 shows a tunnel oxide layer 1 with end regions 2, 3 below a floating gate 4 of a transistor 5. It further happens that although the end regions of the tunnel oxide layer are initially formed uniformly thin along with the remainder of the layer, during oxidation steps subsequent to gate formation such as, e.g., formation of the source and drain regions, as stated above we have recognized that oxygen can diffuse into the end regions of the tunnel oxide layer, causing the end regions to grow thicker. The resulting upturned upper edges of the end regions, shown at 6 and 7 in FIG. 1, resemble what is colloquially referred to herein as a "bird's beak" profile, "lateral oxide encroachment", and "gate edge lifting". In any case, the thicker end regions inhibit erase current and cause the erase current to be concentrated through thinner portions of the gate edge lifting profile, thereby decreasing floating gate erase uniformity and overall chip reliability. The present invention recognizes the above-noted "gate edge lifting" problem and provides the solutions set forth below.

BRIEF SUMMARY OF THE INVENTION

A method for establishing at least one transistor on a semiconductor device includes providing a semiconductor substrate and establishing at least one tunnel oxide layer on the substrate. The method further includes forming at least one transistor gate stack including the tunnel oxide layer. In accordance with the present invention, at least one barrier film is established on the gate stack, after which source and drain regions are established in the substrate. With this invention, the barrier film inhibits diffusion of oxygen into the edge of the tunnel oxide layer as, e.g., the source and drain regions are established.

In a preferred embodiment, the barrier film has a thickness of between twenty Angstroms and two hundred Angstroms (20 Å–200 Å), and more preferably the barrier film has a thickness of between fifty Angstroms and one hundred fifty Angstroms (50 Å–150 Å). As set forth below, the barrier film can be made of oxide such as Silicon dioxide ($SiO_2$), Silicon oxynitride (SiON), or stoichiometric silicon nitride ($Si_3N_4$), and the film can be established by growing it at a temperature of between seven hundred fifty degrees Celsius and one thousand fifty degrees Celsius (750° C.–1050° C.) or by depositing it using high temperature oxide (HTO) chemical vapor deposition at between 350° C.–900° C., or by using chemical vapor deposition (CVD), PCVD, or PECVD.

In addition, the method can include establishing a second barrier film over the first barrier film. One or both of the barrier films can be removed after establishing the source and drain regions.

In another aspect, a method for making an ultra-large scale integration (ULSI) semiconductor device includes providing a semiconductor substrate and establishing a transistor gate on a tunnel oxide layer that has at least one exposed side surface extending between the transistor gate and the substrate. Furthermore, the present method includes forming source and drain regions in the substrate beneath the tunnel oxide layer. As intended by present principles, during the forming act, oxidation of the exposed side surface of the tunnel oxide layer is inhibited.

In yet another aspect, a semiconductor device includes a transistor gate on a semiconductor substrate and a tunnel oxide layer sandwiched between the gate and the substrate. The tunnel oxide layer defines an edge extending between the substrate and the gate. A source region and a drain region are in the substrate below the gate, and at least one barrier film covers at least the edge of the tunnel oxide layer.

Other features of the present invention are disclosed or apparent in the section entitled "DETAILED DESCRIPTION OF THE INVENTION".

BRIEF DESCRIPTION OF DRAWINGS

FIG. 1 is a schematic side view of a MOSFET transistor formed without benefit of the present invention, showing a field oxide layer that is thicker at the edges of the gate stack due to an oxidizing environment;

FIG. 2 is a flow chart showing the steps of the present invention; and

DETAILED DESCRIPTION OF THE INVENTION

Figure 3:
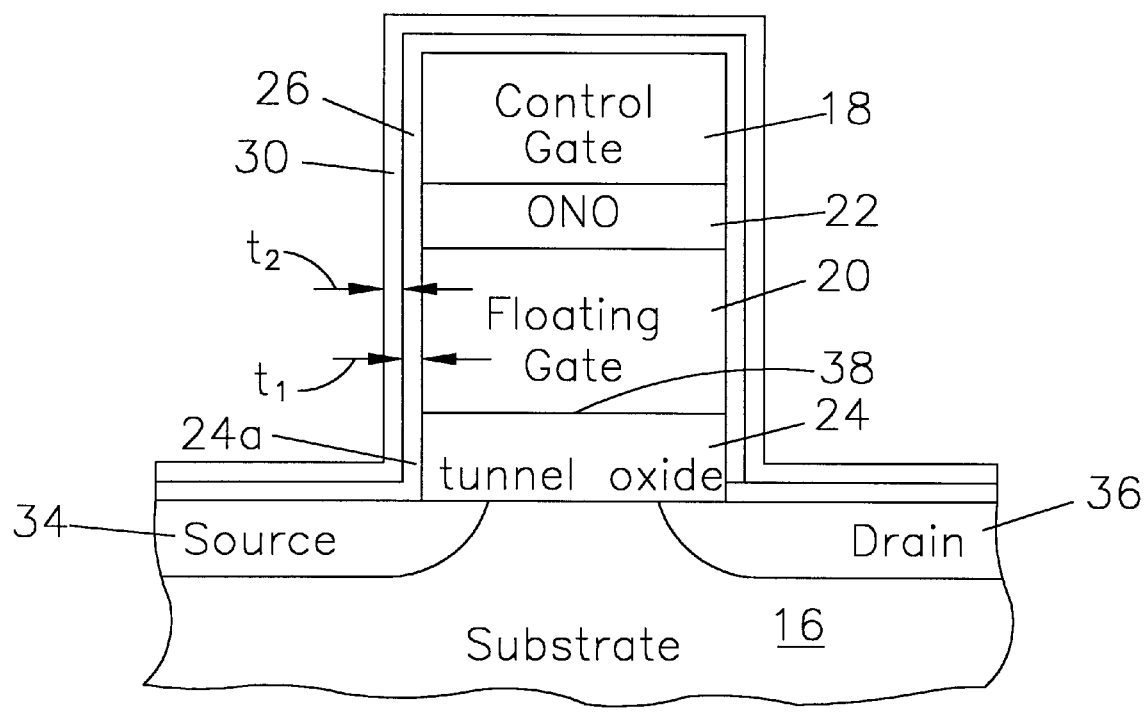
FIG. 3 is a side view of the device processed according to the present invention, after formation of the source and drain regions.

The present invention is directed to a semiconductor device embodied as a chip that can be incorporated into a digital processing apparatus such as a computer. The chip is made in accordance with the below disclosure and can be incorporated into a computing device in accordance with principles known in the art.

Now referring to FIGS. 2 and 3, as indicated at block 14 in FIG. 2 and as shown in FIG. 3, a transistor gate stack is formed on a silicon substrate 16. More specifically, a gate stack including an upper control gate 18, a floating gate 20, and an insulating layer 22 such as oxynitride oxide (ONO) sandwiched between the gates 18, 20 is formed, patterned, and sealed by conventional means above the substrate 16 after having first deposited a thin tunnel oxide layer 24 on the substrate 16. At this point of the process, the tunnel oxide layer 24 includes an exposed side surface 24a that extends between the floating gate 20 and substrate 16. Although only a single gate stack is shown for clarity of disclosure, the chip 10 typically includes many such stacks.

Moving to block 25 of FIG. 2, a first barrier film 26 is deposited over the gate stack to cover the sides 24a of the tunnel oxide layer 24, prior to any subsequent oxidation events such as can occur when, e.g., source and drain regions are formed in the substrate 16. Accordingly, the first barrier film 26 preferably is deposited immediately after the gate is formed. The purpose of the barrier film 26 is to inhibit oxygen from diffusing into the exposed side surface 24a of the tunnel oxide layer 24 and causing the tunnel oxide layer 24 from assuming the gate edge lifting profile shown in FIG. 1. In other words, the purpose of the barrier film 26 is to inhibit thickening of at least the exposed end portions of the tunnel oxide layer 24 during subsequent oxidation steps by sealing the exposed edges of the gate from oxidation.

In one preferred embodiment, the first barrier film 26 is established by depositing or thermally growing a layer of oxide over the gate and substrate 16. The oxide can be Silicon dioxide ($SiO_2$), Silicon oxynitride (SiON), stoichiometric silicon nitride ($Si_3N_4$), or any other film that can slow down the diffusion of oxygen. When the first barrier film is $SiO_2$ or SiON, it can be thermally grown at between seven hundred fifty degrees Celsius and one thousand fifty degrees Celsius (750° C.–1050° C.), or it can be deposited using high temperature oxide (HTO) chemical vapor deposition principles or other deposition techniques including CVD, PCVD, PECVD at 350° C.–900° C. The SiON layer can have a uniform thickness $t_1$ of between twenty Angstroms and two hundred Angstroms (20 Å–200 Å), and more preferably a thickness of between fifty Angstroms and one hundred fifty Angstroms (50 Å–150 Å).

As yet another alternative, the first barrier film 26 can be established by a layer of nitride, e.g., Silicon nitride ($Si_3N_4$), that is deposited to cover the gate and the substrate 16. In one preferred embodiment, the layer of Silicon nitride can be deposited using low pressure chemical vapor deposition (LPCVD) principles at temperatures in the range of seven hundred twenty five degrees Celsius to eight hundred fifty twenty five degrees Celsius (725° C.–825° C.). When the first barrier film is Silicon nitride, it can have a thickness $t_1$ of between forty Angstroms and two hundred Angstroms (40 Å–200 Å), and more preferably a thickness of between sixty Angstroms and one hundred fifty Angstroms (60 Å–150 Å). PECVD or other vapor deposition techniques can be used.

In addition to the first barrier film 26, as indicated at block 28 in FIG. 2 and as shown in FIG. 3, a second or outer barrier film 30 can be established to cover the first barrier film 26, if desired, for added oxidation protection. The second or outer barrier film 30 can be made of nitride such as Silicon nitride that is deposited using LPCVD principles, or Silicon oxynitride (SiON), or Silicon-rich nitride, or Silicon dioxide. In any case, the thickness $t_2$ of the second or outer barrier film 30 can be 20 Å–200 Å.

After depositing the film 26 or films 26, 30, the process can move to block 32 in FIG. 2 to undertake additional conventional processing steps in accordance with principles known in the art, including the formation of a source 34 and drain 36 in the substrate 16 beneath the gate stack as shown. Despite these additional steps, which could otherwise cause unwanted oxidation of the tunnel oxide layer 24 at its end regions, owing to the film or films 26, 30 oxidation of the tunnel oxide layer 24 is inhibited. Consequently, the upper surface 38 of the tunnel oxide layer 24 is substantially flat even at the sides of the layer 24, and does not exhibit the undesired "gate edge lifting" profile shown in FIG. 1. If desired, one or both of the films 26, 30 can be removed at block 40 of FIG. 2 by, e.g., wet etching.

While the particular METHOD FOR INHIBITING TUNNEL OXIDE GROWTH AT THE EDGES OF A FLOATING GATE DURING SEMICONDUCTOR DEVICE PROCESSING as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A gate stack semiconductor device, comprising:
   at least one transistor gate;
   a semiconductor substrate;
   at least one tunnel oxide layer disposed between the gate and the substrate, the at least one tunnel oxide layer defining at least one edge extending between the substrate and the at least one gate;
   a source region and a drain region in the substrate below the at least one gate;
   at least one inner barrier film covering at least the edge of the at least one tunnel oxide layer,
      said at least one inner barrier film having a uniform thickness in a range of 20 Å to 200 Å,
      said at least one inner barrier film comprising at least one material selected from a group consisting essentially of: stoichiometric silicon nitride ($Si_3N_4$), silicon dioxide ($SiO_2$), and silicon oxynitride (SiON); and
   an outer barrier film covering said at least one inner barrier film, said outer barrier film having a uniform thickness in a range of 20 Å to 200 Å, said outer barrier film comprising silicon-rich silicon nitride ($Si_{3+n}N_4$),
   said at least one inner barrier film and said outer barrier film, together, preventing formation of "bird's beak" structures during subsequent oxidation steps.

2. The device of claim 1, wherein the barrier film has a thickness of between fifty Angstroms and one hundred fifty Angstroms (50 Å–150 Å).

3. The device of claim 1, wherein said barrier film is thermally grown in the temperature range between seven hundred fifty degrees Celsius and one thousand fifty degrees Celsius (750° C.–1050° C.).

4. The device of claim 1, wherein said barrier film is deposited using chemical vapor deposition in the temperature range between three hundred fifty degrees Celsius and nine hundred degrees Celsius (350° C.–900° C.).

5. The device of claim 1, wherein said barrier film is stoichiometric Silicon nitride ($Si_3N_4$) deposited using low pressure chemical vapor deposition at a temperature in the range of seven hundred twenty five degrees Celsius to eight hundred twenty five degrees Celsius (725° C.–825° C.).

6. The device of claim 1, wherein said second barrier film has a thickness of between fifty Angstroms and one hundred fifty Angstroms (50 Å–150 Å).

7. The device of claim 1, wherein said second barrier film is thermally grown in the temperature range between seven hundred fifty degrees Celsius and nine hundred degrees Celsius (750° C.–900° C.).

8. The device of claim 1, wherein said second barrier film is deposited using chemical vapor deposition in the temperature range between three hundred fifty degrees Celsius and nine hundred degrees Celsius (350° C.–900° C.).

9. The device of claim 1, wherein said second barrier film is Stoichiometric Silicon nitride ($Si_3N_4$) deposited using low pressure chemical vapor deposition at a temperature in the range of seven hundred twenty five degrees Celsius to eight hundred twenty five degrees Celsius (725° C.–825° C.).

10. A semiconductor device, comprising:
    a semiconductor substrate;
    at least one transistor gate on at least one tunnel oxide layer having at least one exposed side surface extending between the at least one transistor gate and the substrate;
    a source region and a drain region in the substrate below the at least one tunnel oxide layer; and
    at least one inner barrier film covering at least the edge of the at least one tunnel oxide layer,
       said at least one inner barrier film having a uniform thickness in the range of 20 Å to 200 Å,
    said at least one inner barrier film comprising at least one material selected from a group consisting essentially of: stoichiometric silicon nitride ($Si_3N_4$), silicon dioxide ($SiO_2$), and silicon oxynitride (SiON); and
    an outer barrier film covering said at least one inner barrier film, said outer barrier film having a uniform thickness in a range of 20 Å to 200 Å, said outer barrier film comprising silicon-rich silicon nitride ($Si_{3+n}N_4$),
    said at least one inner barrier film and said outer barrier film, together, preventing formation of "bird's beak" structures during subsequent oxidation steps.

11. The device of claim 10, wherein said barrier film is from the group of Silicon dioxide ($SiO_2$), Silicon oxynitride (SiON), stoichiometric Silicon nitride ($Si_3N_4$), deposited using chemical vapor deposition in the temperature range between three hundred fifty degrees Celsius and nine hundred degrees Celsius (350° C.–900° C.).

12. The device of claim 10, wherein said barrier film is stoichiometric Silicon nitride ($Si_3N_4$) deposited using low pressure chemical vapor deposition at a temperature in the range of seven hundred twenty five degrees Celsius to eight hundred twenty five degrees Celsius (725° C.–825° C.).

13. A gate stack semiconductor device, comprising:
    at least one transistor gate;
    a semiconductor substrate;
    at least one tunnel oxide layer disposed between the at least one gate and the substrate, the at least one tunnel oxide layer defining at least one edge extending between the substrate and the at least one gate;
    a first barrier film covering at least the edge of the at least one tunnel oxide layer,
       said first barrier film having a uniform thickness of 20 Å to 200 Å,
       said first barrier film comprising stoichiometric silicon nitride ($Si_3N_4$); and
    a second barrier film covering the first barrier film,
       said second barrier film having a uniform thickness range of 20 Å to 200 Å,
       said second barrier film comprising silicon-rich silicon nitride ($Si_{3+n}N_4$), and
    said first and second barrier films, together, preventing formation of "bird's beak" structures during subsequent oxidation steps.

* * * * *